United States Patent
Shimizu et al.

(10) Patent No.: US 11,783,886 B2
(45) Date of Patent: Oct. 10, 2023

(54) SEMICONDUCTOR DEVICE CAPABLE OF SWITCHING OPERATION VOLTAGE

(71) Applicant: MICRON TECHNOLOGY, INC., Boise, ID (US)

(72) Inventors: Hiroshi Shimizu, Sagamihara (JP); Yuki Miura, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 111 days.

(21) Appl. No.: 17/495,706

(22) Filed: Oct. 6, 2021

(65) Prior Publication Data

US 2023/0104041 A1 Apr. 6, 2023

(51) Int. Cl.

| | |
|---|---|
| *G11C 5/14* | (2006.01) |
| *G11C 11/4074* | (2006.01) |
| *G11C 11/4093* | (2006.01) |
| *H03K 17/56* | (2006.01) |
| *G11C 5/02* | (2006.01) |
| *G11C 5/06* | (2006.01) |

(52) U.S. Cl.
CPC .......... *G11C 11/4074* (2013.01); *G11C 5/025* (2013.01); *G11C 5/063* (2013.01); *G11C 5/147* (2013.01); *G11C 11/4093* (2013.01); *H03K 17/56* (2013.01)

(58) Field of Classification Search
CPC .. G11C 11/4074; G11C 11/4093; H03K 17/56
See application file for complete search history.

(56) References Cited

U.S. PATENT DOCUMENTS

| | | | |
|---|---|---|---|
| 11,009,902 B1* | 5/2021 | Miwa | G11C 11/4074 |
| 2004/0151050 A1* | 8/2004 | Ooishi | G11C 11/4074 |
| | | | 365/226 |
| 2011/0254617 A1* | 10/2011 | Ishii | G11C 5/06 |
| | | | 327/543 |
| 2012/0249226 A1* | 10/2012 | Ishii | H01L 27/11807 |
| | | | 327/534 |
| 2019/0074834 A1* | 3/2019 | Sato | H01L 23/5286 |
| 2020/0105332 A1* | 4/2020 | Hamada | G11C 11/4091 |

* cited by examiner

*Primary Examiner* — Mushfique Siddique
(74) *Attorney, Agent, or Firm* — Dorsey & Whitney LLP

(57) ABSTRACT

Disclosed herein is an apparatus that includes: a driver circuit configured to operate on a power voltage supplied from an internal power supply line; a first external power supply line supplied with a first external power voltage; a second external power supply line supplied with a second external power voltage; a plurality of first switch circuits coupled between the first external power supply line and the internal power supply line, the plurality of first switch circuits being arranged on a plurality of first circuit areas; and a plurality of second switch circuits coupled between the second external power supply line and the internal power supply line, the plurality of second switch circuits being arranged on a plurality of second circuit areas. The plurality of first circuit areas and the plurality of second circuit areas are arranged in a first direction in a predetermined order.

14 Claims, 18 Drawing Sheets

SEMICONDUCTOR DEVICE CAPABLE OF SWITCHING OPERATION VOLTAGE

BACKGROUND

Some semiconductor devices such as a DRAM (Dynamic Random Access Memory) are configured to be capable of switching the operation voltage of some internal circuits. These semiconductor devices include a switch circuit for switching the operation voltage. It is desirable that the wiring resistance from an external power supply terminal to the switch circuit is set as low as possible.

BRIEF DESCRIPTION OF THE DRAWINGS

FIG. 10A shows a layout according to the first embodiment of the present disclosure, and FIG. 10B shows a layout according to a comparative example;

DETAILED DESCRIPTION

Various embodiments of the present disclosure will be explained below in detail with reference to the accompanying drawings. The following detailed description refers to the accompanying drawings that show, by way of illustration, specific aspects, and embodiments in which the present disclosure may be practiced. These embodiments are described in sufficient detail to enable those skilled in the art to practice the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
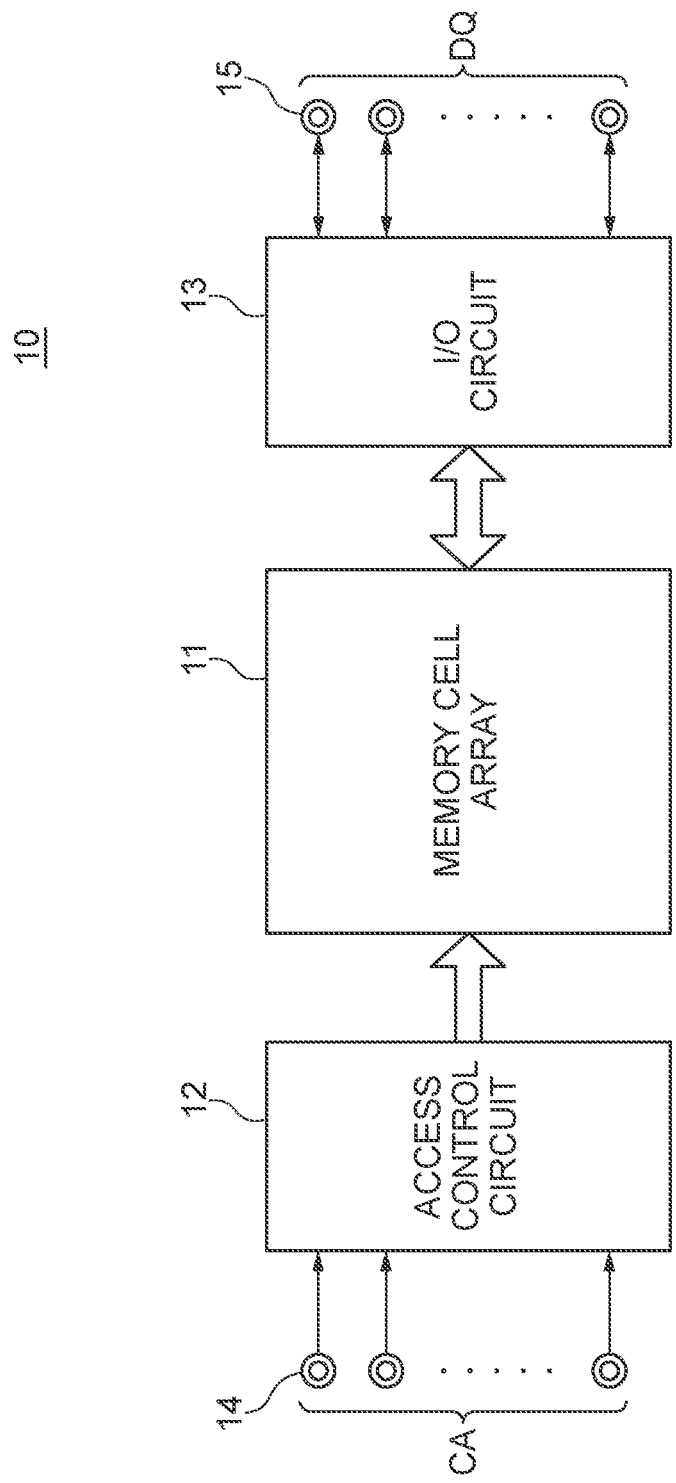
FIG. 1 is a block diagram showing a configuration of a semiconductor device according to an embodiment of the present disclosure.

FIG. 1 is a block diagram showing a configuration of a semiconductor device 10 according to an embodiment of the present disclosure. The semiconductor device 10 shown in FIG. 1 is, for example, a DRAM and includes a memory cell array 11, an access control circuit 12 that performs an access for the memory cell array 11, and an I/O circuit 13 that performs input/output of data to/from the memory cell array 11. The access control circuit 12 performs an access for the memory cell array 11 on the basis of a command address signal CA input from an external controller via a command address terminal 14. At the time of a read operation, data DQ read from the memory cell array 11 is output to data I/O terminals 15 via the I/O circuit 13. At the time of a write operation, data DQ input from an external controller to the data I/O terminals 15 is written to the memory cell array 11 via the I/O circuit 13.

Figure 2:
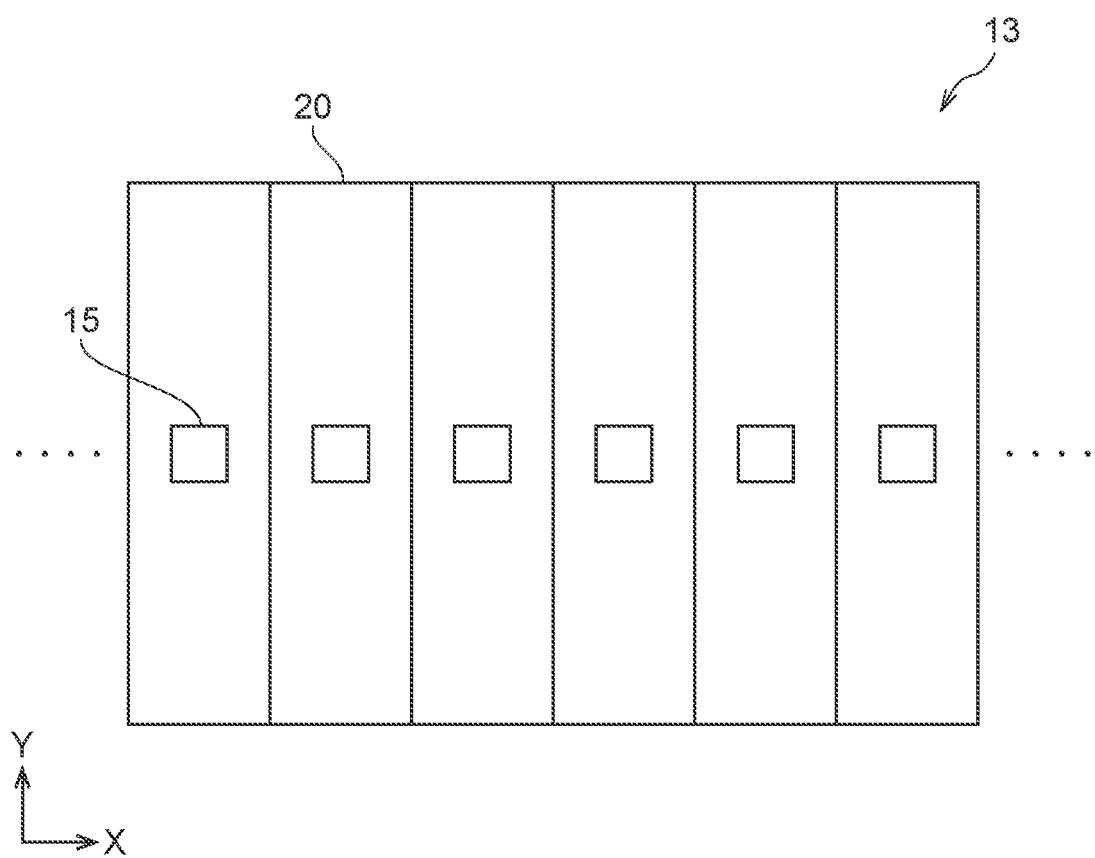
FIG. 2 is a schematic plan view showing a layout of main parts of an I/O circuit according to an embodiment of the present disclosure.
Figure 3:
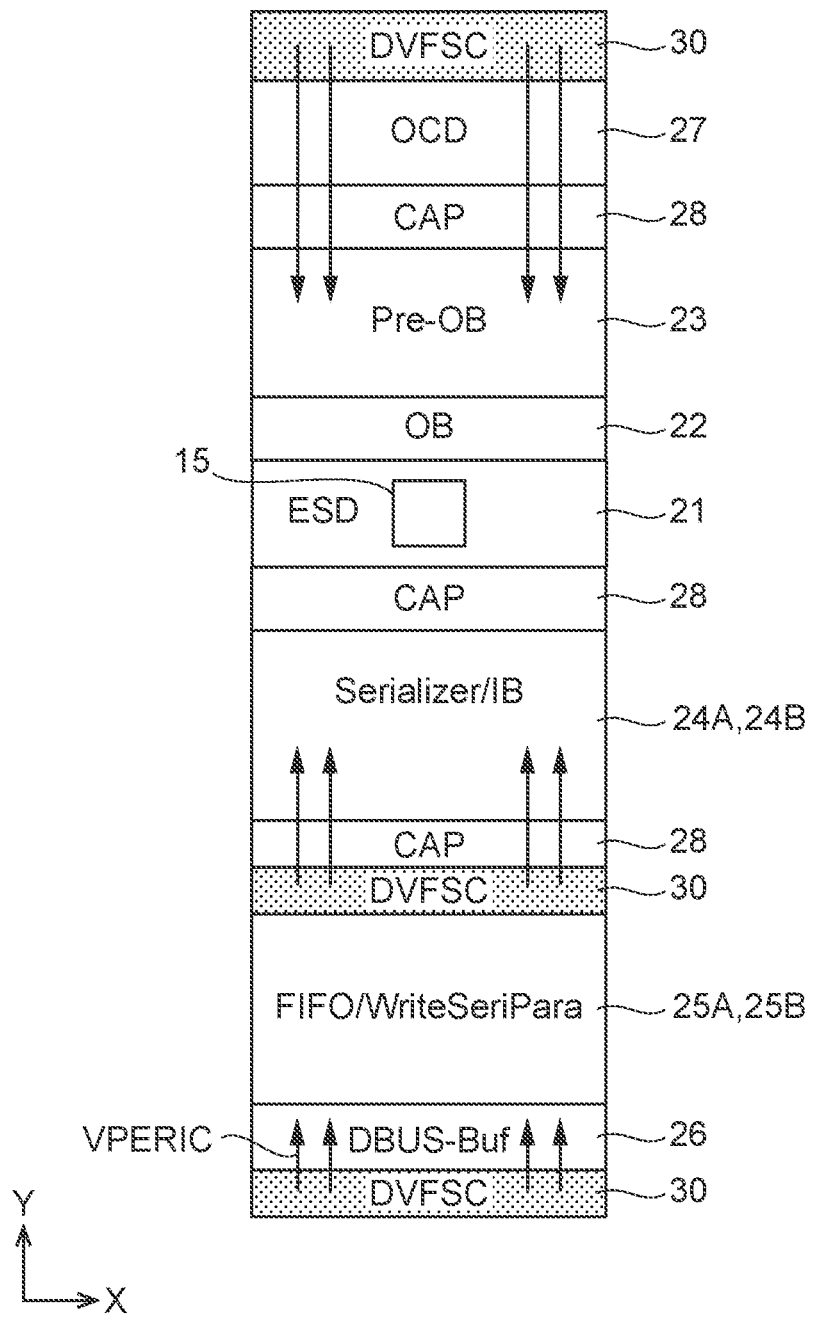
FIG. 3 is a schematic plan view showing a layout of a unit circuit according to an embodiment of the present disclosure.

FIG. 2 is a schematic plan view showing a layout of main parts of the I/O circuit 13 according to an embodiment of the present disclosure. In the example shown in FIG. 2, the data I/O terminals 15 are arrayed in an X direction and a unit circuit 20 is allocated to each of the data I/O terminal 15. Each of the unit circuits 20 is laid out in a rectangular region with a Y direction as the longitudinal direction. FIG. 3 is a schematic plan view showing a layout of the unit circuit 20 according to an embodiment of the present disclosure. In the example shown in FIG. 3, the unit circuit 20 includes an ESD (electrostatic discharge) protection circuit 21, an output buffer circuit 22, a pre-buffer circuit 23, a serializer 24A, an input receiver circuit 24B, a FIFO (first-in first-out) circuit 25A, a serial-parallel conversion circuit 25B, a data bus buffer circuit 26, an off-chip driver circuit 27, compensation capacitors 28, and power selector circuits 30. The ESD protection circuit 21 is placed at a location overlapping with an associated one of the data I/O terminals 15. The output buffer circuit 22 is a circuit that outputs read data DQ to the data I/O terminal 15 at the time of a read operation. The pre-buffer circuit 23 is a circuit that drives the output buffer circuit 22 on the basis of the read data DQ. The serializer 24A is a circuit that converts parallel read data DQ into serial data and supplies the serial data to the pre-buffer circuit 23. The input receiver circuit 24B is a circuit data receives write data DQ input via the data I/O terminal 15 at the time of a write operation. The FIFO circuit 25A is a circuit that supplies the read data DQ supplied from the memory cell array 11 via a data bus to the serializer 24A at the time of a read operation. The serial-parallel conversion circuit 25B is a circuit that converts serial write data DQ output from the input receiver circuit 24B to parallel data. The data bus buffer circuit 26 is a circuit that outputs the converted parallel write data DQ to the data bus. The off-chip driver circuit 27 is a circuit that reduces a difference between a rising time and a falling time of the read data DQ by adjusting the resistance value of the output buffer circuit 22. The compensation capacitors 28 are circuits for suppressing power supply noise. The power selector circuits 30 are circuits that change the level of a power voltage VPERIC supplied to the pre-buffer circuit 23, the serializer 24A, the input receiver circuit 24B, and the data bus buffer circuit 26.

Figure 4:
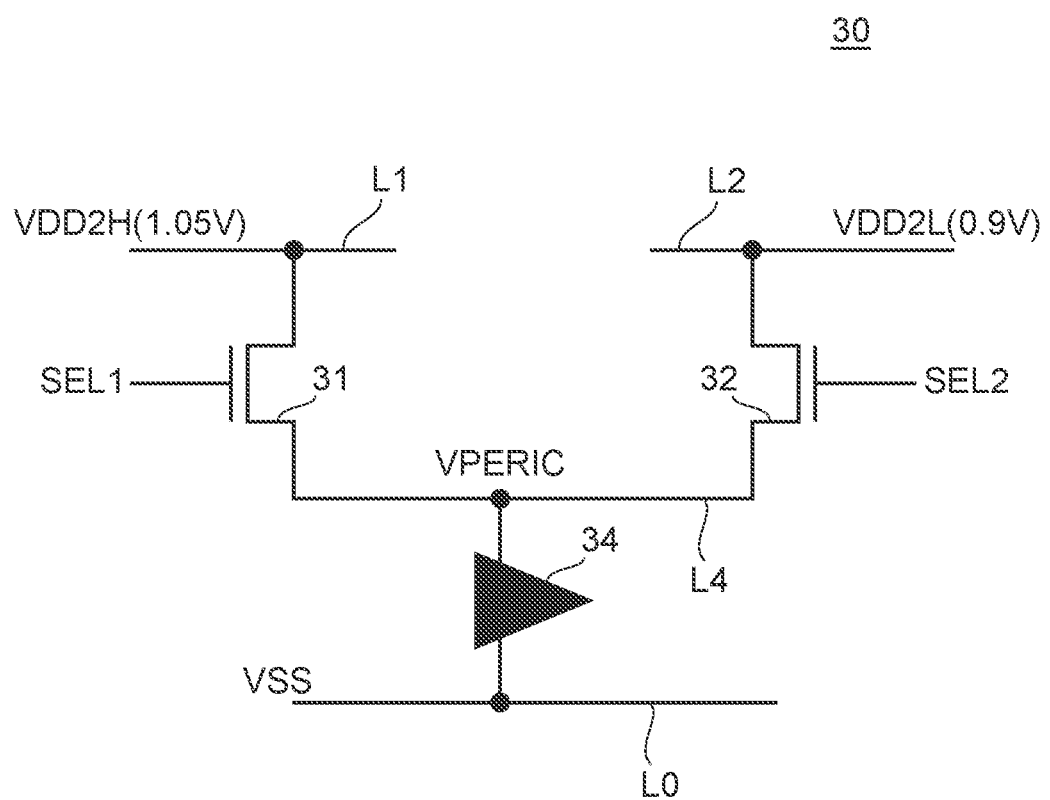
FIG. 4 is a circuit diagram of power selector circuits according to an embodiment of the present disclosure.

FIG. 4 is a circuit diagram of the power selector circuits 30 according to an embodiment of the present disclosure. As shown in FIG. 4, each of the power selector circuits 30 includes a switch circuit 31 coupled between a power supply line L1 and a power supply line L4, and a switch circuit 32 coupled between a power supply line L2 and the power supply line L4. The switch circuits 31 and 32 are both constituted of an N-channel MOS transistor. While being represented by one transistor in FIG. 4, each of the switch circuits 31 and 32 may have a configuration in which a plurality of transistors are coupled in parallel. A selection signal SEL1 is supplied to the gate electrode of the transistor constituting the switch circuit 31. A selection signal SEL2 is supplied to the gate electrode of the transistor constituting the switch circuit 32. The selection signal SEL1 and the selection signal SEL2 are activated mutually exclusively. A power voltage VDD2H is supplied from outside to the power supply line L1. A power voltage VDD2L is supplied from outside to the power supply line L2. The power voltage VDD2H and the power voltage VDD2L have different levels. As an example, the power voltage VDD2H is 1.05 V (volts) and the power voltage VDD2L is 0.9 V. The power supply line L4 is an internal power supply line for supplying a power voltage VPERIC to the driver circuit 34. The driver circuit 34 is a circuit included in the pre-buffer circuit 23, the serializer 24A, the input receiver circuit 24B, and the data bus buffer circuit 26 and operates on a voltage between the power voltage VPERIC supplied to the power supply line L4 and a power voltage VSS supplied to a power supply line L0. Accordingly, the driver circuit 34 included in the pre-buffer circuit 23, the serializer 24A, the input receiver circuit 24B, and the data bus buffer circuit 26 operates on the power voltage VDD2H (=1.05 V) when the selection signal SEL1 is activated, and the driver circuit 34 included in the pre-buffer circuit 23, the serializer 24A, the input receiver circuit 24B, and the data bus buffer circuit 26 operates on the power voltage VDD2L (0.9 V) when the selection signal SEL2 is activated. Therefore, the driver circuit 34 can be operated at a higher speed when the selection signal SEL1 is activated and the current consumption of the driver circuit 34 can be reduced when the selection signal SEL2 is activated.

Figure 5:
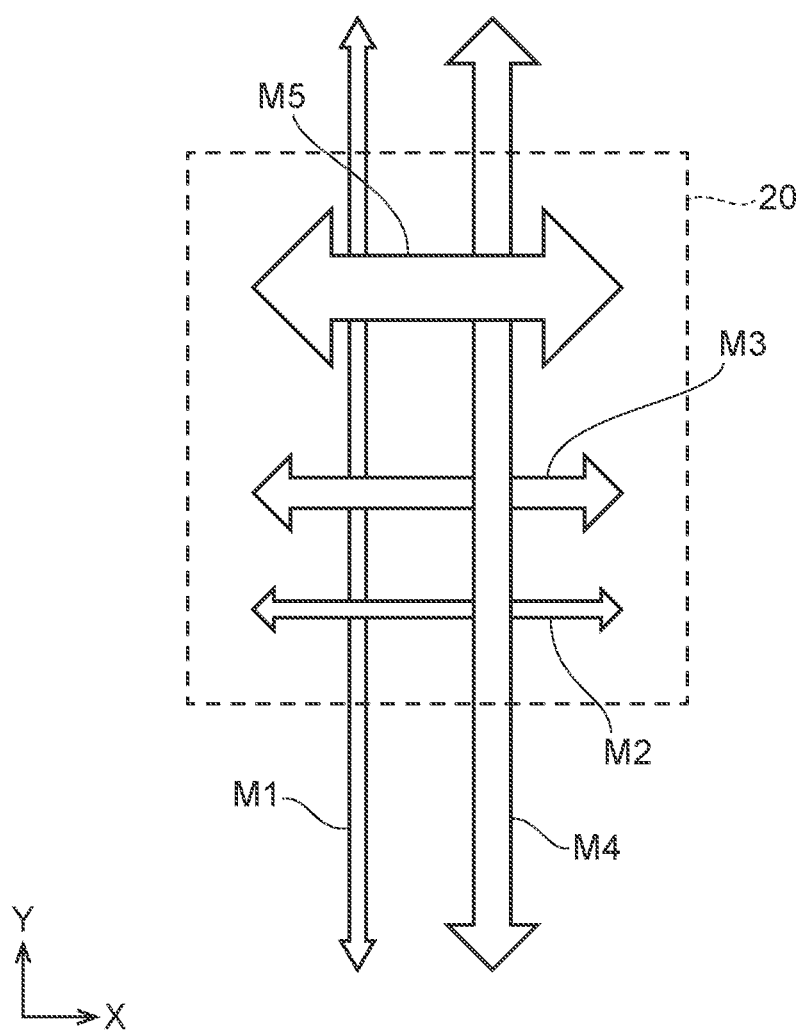
FIG. 5 is a schematic diagram for explaining an extending direction of wiring layers included in unit circuits according to an embodiment of the present disclosure.
Figure 6:
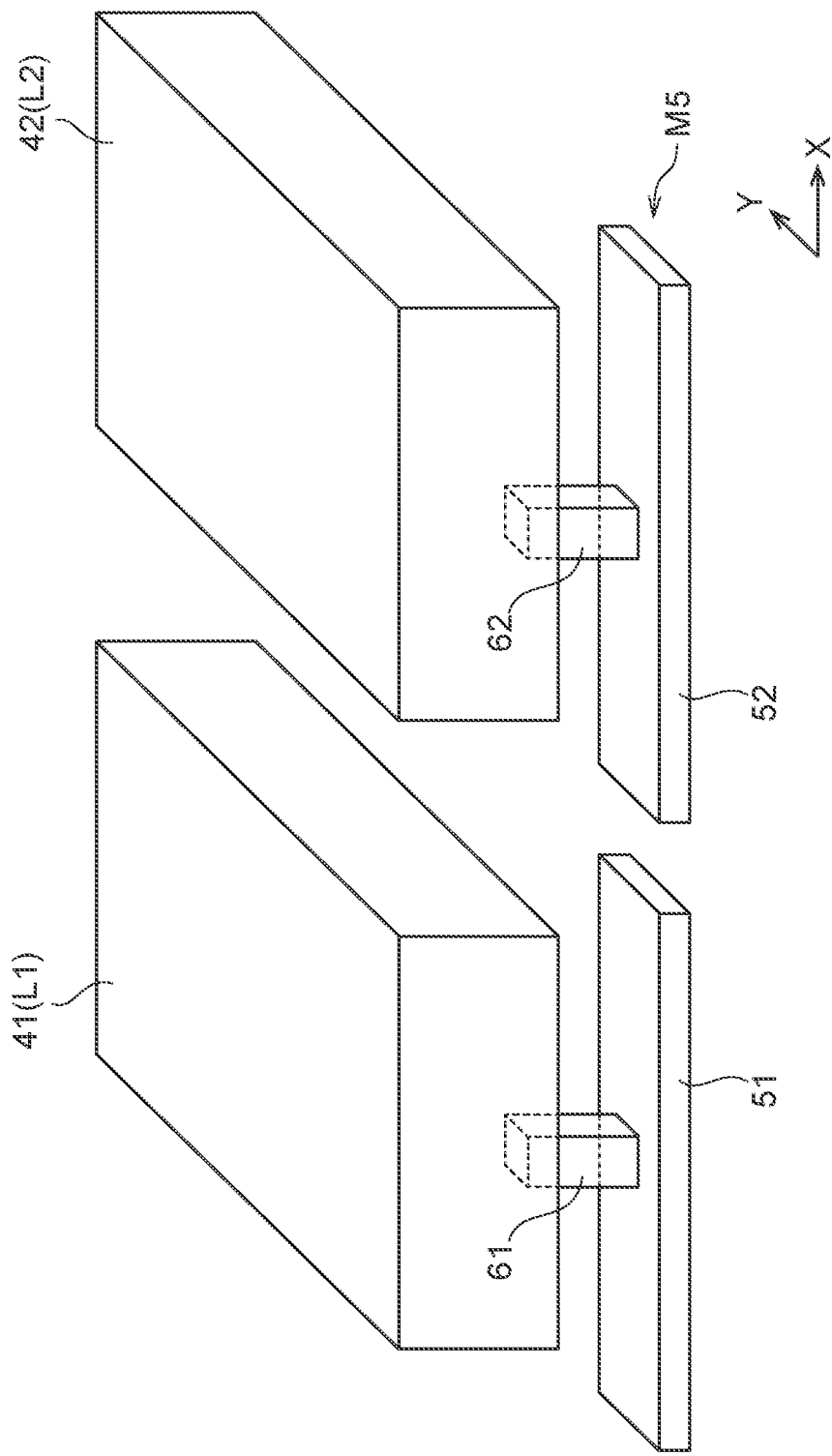
FIG. 6 is a schematic diagram of an iRDL (inline redistribution layer) according to an embodiment of the present disclosure.

FIG. 5 is a schematic diagram for explaining the extending direction of wiring layers included in the unit circuits 20 according to an embodiment of the present disclosure. In the example shown in FIG. 5, wiring layers M1 to M5 are provided on a semiconductor substrate on which the unit circuits 20 are formed. The wiring layer M1 is a wiring layer positioned in a lowermost layer and extends mainly in the Y direction. The wiring layer M2 is a wiring layer positioned above the wiring layer M1 and extends mainly in the X direction. The wiring layer M3 is a wiring layer positioned above the wiring layer M2 and extends mainly in the X direction. The wiring layer M4 is a wiring layer positioned above the wiring layer M3 and extends mainly in the Y direction. The wiring layer M5 is a wiring layer positioned above the wiring layer M4 and extends mainly in the X direction. The widths and thicknesses of lines provided on the wiring layers M1 to M5 may be larger in upper layers. On a layer above the wiring layer M5, iRDLs (inline redistribution layers) 41 and 42 shown in FIG. 6 are placed. The iRDLs 41 and 42 are power iRDL lines positioned in the uppermost layer and are positioned in the same wiring layer as external terminals (pad electrodes). The line widths and line thicknesses of the iRDLs 41 and 42 are significantly larger than those of the wiring layer M5. The iRDL 41 corresponds to the power supply line L1 shown in FIG. 4 and is coupled to an external power terminal supplied with the power voltage VDD2H. The iRDL 42 corresponds to the power supply line L2 shown in FIG. 4 and is coupled to an external power terminal supplied with the power voltage VDD2L. Conductive patterns 51 and 52 located on the wiring layer M5 are shown in FIG. 6. The iRDLs 41 and 42 are coupled to the conductive patterns 51 and 52 through via conductors 61 and 62, respectively. The via conductor 61 is a first iRDL via and the via conductor 62 is a second iRDL via. The via conductors 61 and 62 have via diameters significantly larger than those of other via conductors coupling the wiring layers M1 to M5 to each other and are accordingly difficult to arrange at a high density unlike other via conductors.

Figure 7:
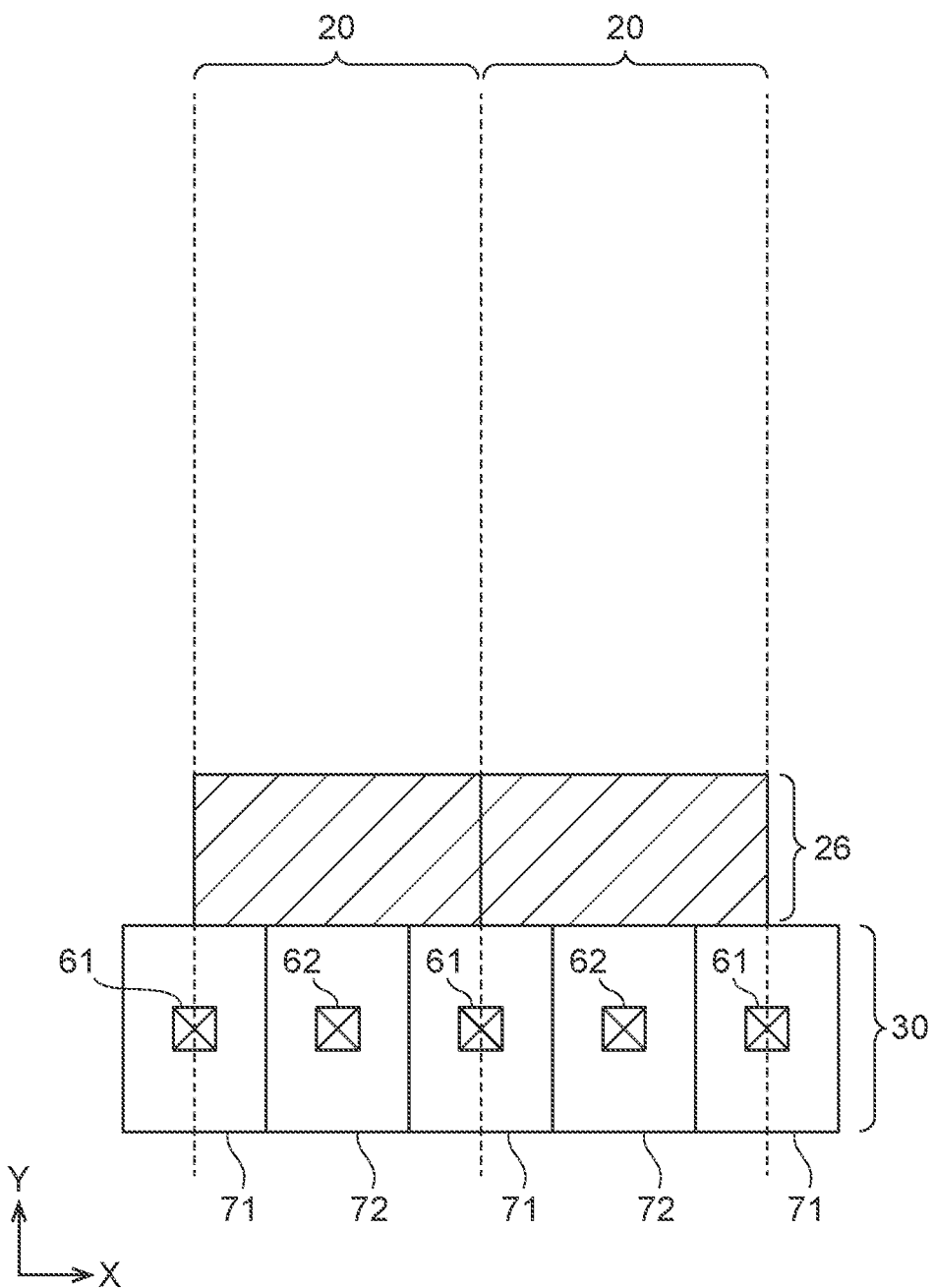
FIG. 7 is a schematic diagram showing a layout of a power selector circuit according to an embodiment of the present disclosure.

FIG. 7 is a schematic diagram showing a layout of one of the power selector circuits 30 adjacent to the data bus buffer circuit 26 according to an embodiment of the present disclosure. As shown in FIG. 7, the power selector circuit 30 includes a plurality of circuit areas 71 and 72 alternately arranged in the X direction. The circuit areas 71 are areas where the switch circuit 31 shown in FIG. 4 is placed. The circuit areas 72 are areas where the switch circuit 32 shown in FIG. 4 is placed. The power voltage VDD2H is supplied from the iRDL 41 to the switch circuits 31 placed in the circuit areas 71 through the associated via conductors 61, respectively. The power voltage VDD2L is supplied from the iRDL 42 to the switch circuits 32 placed in the circuit areas 72 through the associated via conductors 62, respectively. In the example shown in FIG. 7, the array pitch in the X direction of the unit circuits 20 is twice as large as the array pitch in the X direction of the circuit areas 71 and 72. Boundary locations of the unit circuits 20 adjacent in the X direction are on the circuit areas 71. Other power selector circuits 30 shown in FIG. 3 also have the same layout.

Figure 8:
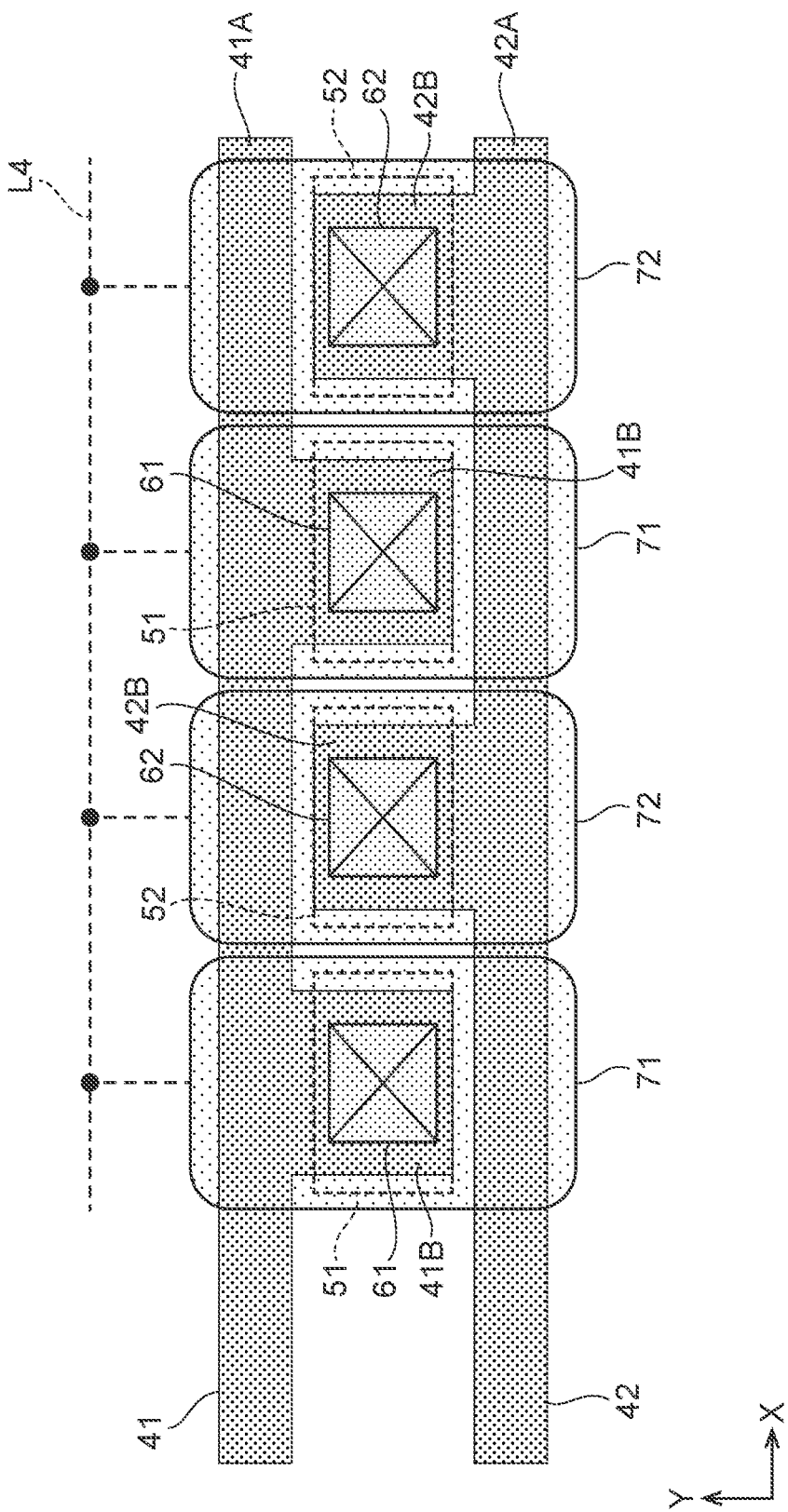
FIG. 8 is a schematic plan view for explaining a layout of via conductors according to a first embodiment of the present disclosure.

FIG. 8 is a schematic plan view for explaining a layout of the via conductors 61 and 62 according to a first embodiment of the present disclosure. As shown in FIG. 8, the iRDL 41 and the iRDL 42 are arrayed in the Y direction. The iRDL 41 includes a line section 41A extending in the X direction, and protruding sections 41B protruding in the Y direction from the line section 41A. Similarly, the iRDL 42 includes a line section 42A extending in the X direction, and protruding sections 42B protruding in the Y direction from the line section 42A. The line sections 41A and 42A constitute a main wiring portion and the protruding sections 41B and 42B constitute a sub wiring portion. The protruding sections 41B of the iRDL 41 protrude toward the line section 42A of the iRDL 42 and the protruding sections 42B of the iRDL 42 protrude toward the line section 41A of the iRDL 41. At least the protruding sections 41B in the iRDL 41 are provided at locations overlapping with the circuit areas 71, respectively. At least the protruding sections 42B in the iRDL 42 are provided at locations overlapping with the circuit areas 72, respectively. The conductor patterns 51 and 52 shown in FIG. 6 are provided in the circuit areas 71 and 72, respectively. The conductive patterns 51 are provided at locations overlapping with the protruding sections 41B of the iRDL 41 and are coupled thereto through the via conductors 61, respectively. The conductive patterns 52 are provided at locations overlapping with the protruding sections 42B of the iRDL 42 and are coupled thereto through the via conductors 62, respectively. In this way, the power voltage VDD2H is supplied to the circuit areas 71 through the iRDL 41 and the via conductors 61, respectively, and the power voltage VDD2L is supplied to the circuit areas 72 through the iRDL 42 and the via conductors 62, respectively. As described above, the switch circuits 31 included in the circuit areas 71 and the switch circuits 32 included in the circuit areas 72 are activated mutually exclusively, so that the power voltage VDD2H or VDD2L is supplied to the power supply line L4. The power supply lines L4 coupled to the circuit areas 71 and 72 are coupled in common via the wiring layers M1 to M5.

Figure 9B:
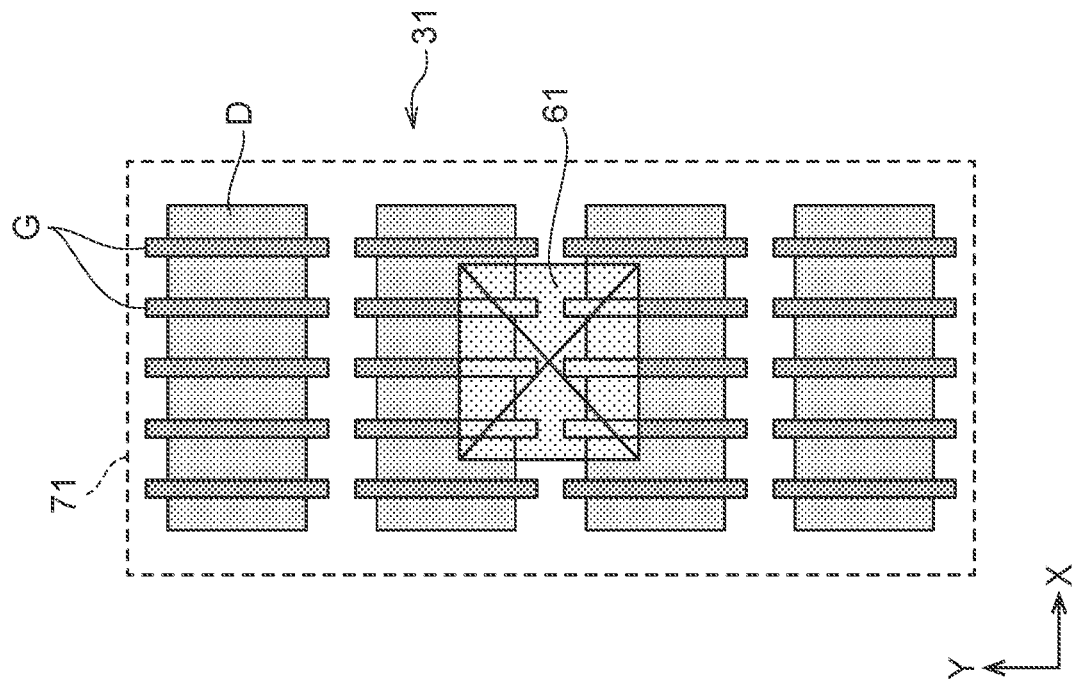
FIG. 9B is a schematic plan view showing another example of the layout of the transistors constituting the switch circuit according to an embodiment of the present disclosure.
Figure 9A:
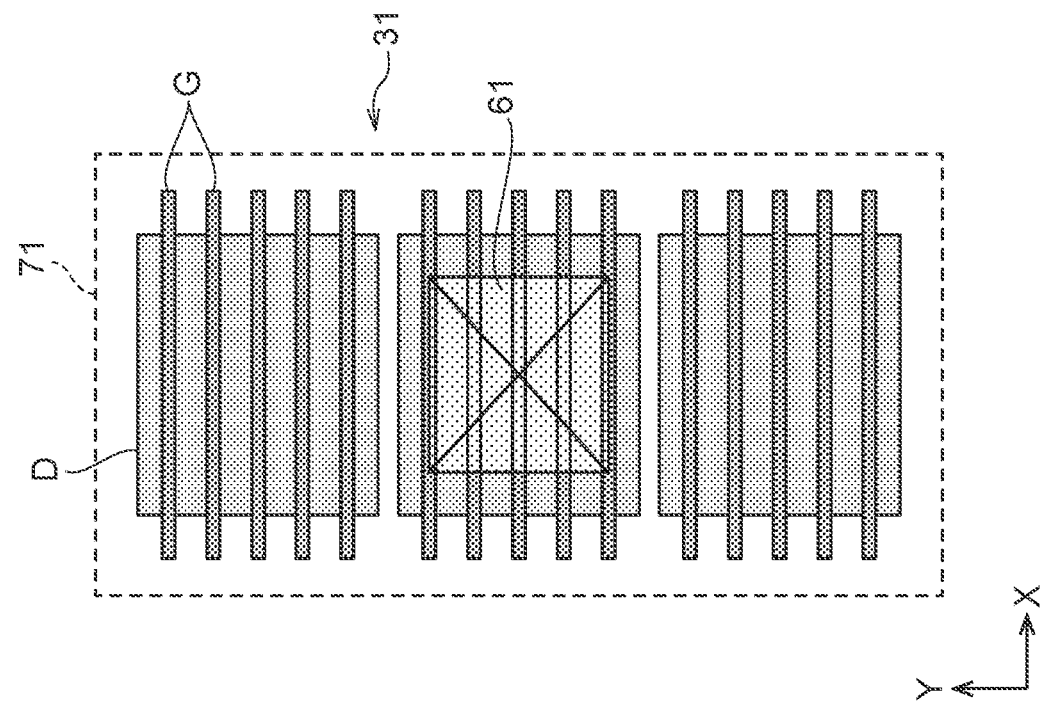
FIG. 9A is a schematic plan view showing an example of a layout of transistors constituting a switch circuit according to an embodiment of the present disclosure.

FIG. 9A is a schematic plan view showing an example of the layout of transistors constituting the switch circuit 31 according to an embodiment of the present disclosure. In the example shown in FIG. 9A, the diffusion region D of the transistors constituting the switch circuit 31 is divided into three parts and a plurality of gate electrodes G extending in the X direction are arrayed in the Y direction in each part of the diffusion region D. The via conductor 61 is laid out to overlap with a part of the diffusion region D positioned at the center in the Y direction. FIG. 9B is a schematic plan view showing another example of the layout of the transistors constituting the switch circuit 31 according to an embodiment of the present disclosure. In the example shown in FIG. 9B, the diffusion region D of the transistors constituting the switch circuit 31 is divided into four parts and a plurality of gate electrodes G extending in the Y direction are arrayed in the X direction in each part of the diffusion region D. The via conductor 61 is laid out to overlap with two parts of the diffusion region D positioned at the center in the Y direction. In this way, the transistors constituting the switch circuit 31 may have a layout where the gate electrodes G extend in the X direction or a layout where the gate electrodes G extend in the Y direction. The same holds true for transistors constituting the switch circuit 32.

Figure 10A:
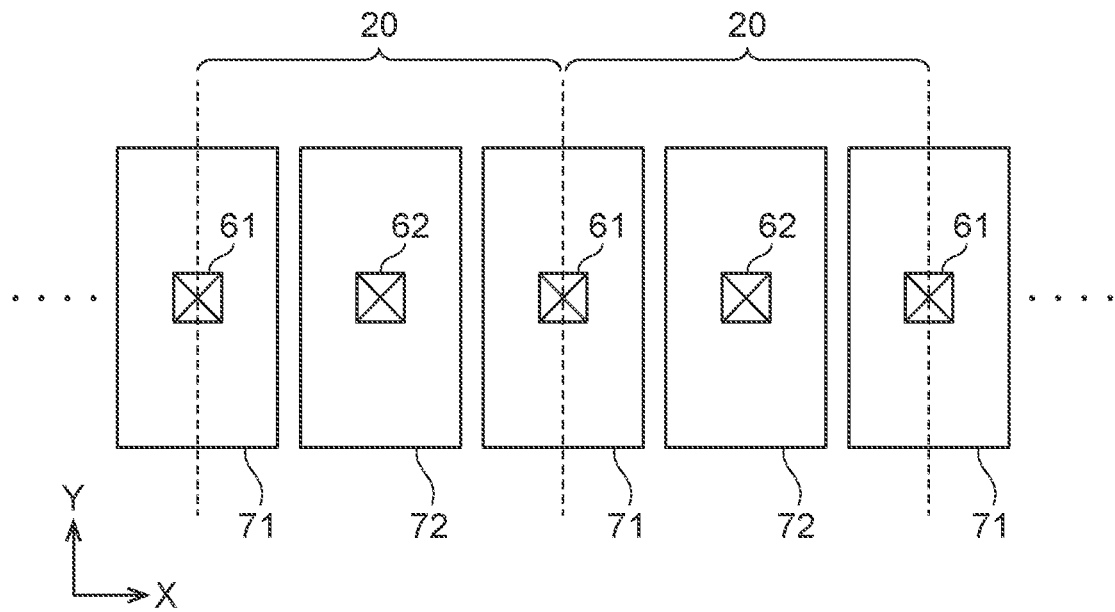
FIGS. 10A and 10B are schematic diagrams for explaining effects of the first embodiment, where
Figure 10B:
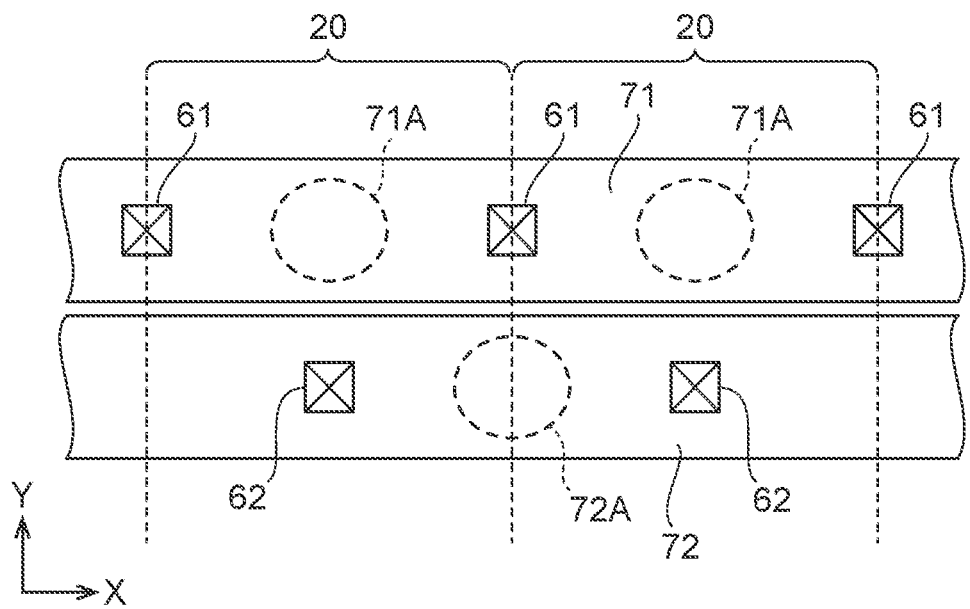

FIGS. 10A and 10B are schematic diagrams for explaining effects of the present embodiment, where FIG. 10A shows a layout according to the present embodiment and FIG. 10B shows a layout according to a comparative example. As shown in FIG. 10B, when the circuit area 71 where the switch circuit 31 is placed and the circuit area 72 where the switch circuit 32 is placed are provided to extend in parallel in the X direction, the distance in the X direction between an area 71A far from associated ones of the via conductors 61, and the via conductors 61 is long in the circuit area 71 and the distance in the X direction between an area 72A far from associated ones of the via conductors 62, and the via conductors 62 in the circuit area 72 is long. Therefore, the wiring resistance of the wiring layer M5 that respectively couples the via conductors 61 and 62 to the areas 71A and 72A is high. In contrast thereto, since the circuit areas 71 and 72 are arranged alternately in the X direction being the extending direction of the wiring layer M5 in the present embodiment as shown in FIG. 10A, the wiring distance of the wiring layer M5 in the circuit areas 71 and 72 can be shortened. Furthermore, since the via conductors 61 and 62 are respectively placed substantially at the centers of the circuit areas 71 and 72 in a planar view, the power voltage VDD2H or VDD2L can be supplied to the switch circuits 31 and 32 with a low resistance.

Figure 11:
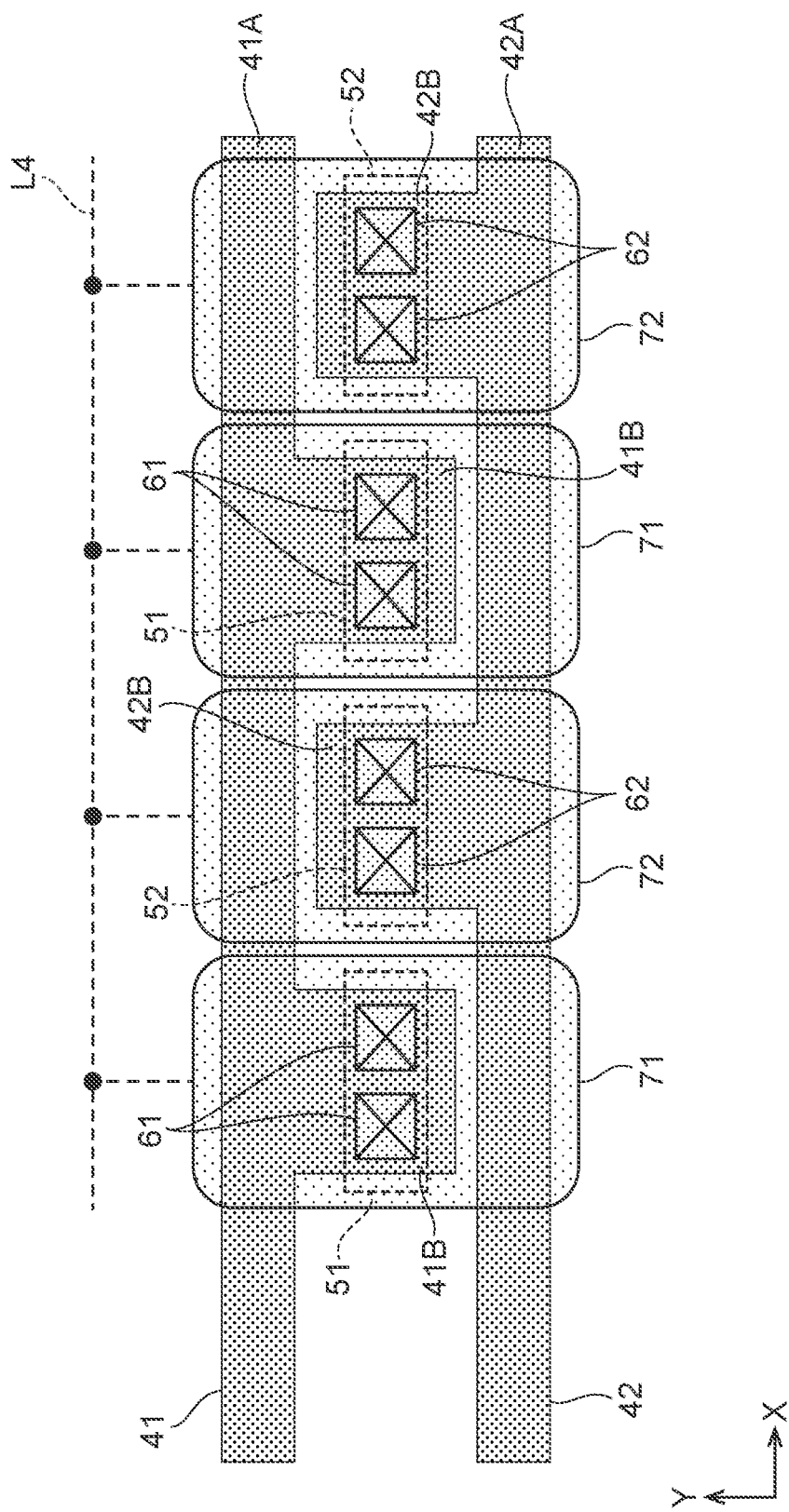
FIG. 11 is a schematic plan view for explaining a layout of via conductors according to a second embodiment of the present disclosure.

FIG. 11 is a schematic plan view for explaining a layout of the via conductors 61 and 62 according to a second embodiment of the present disclosure. In the example shown in FIG. 11, two via conductors 61 are allocated to each of the circuit areas 71 and two via conductors 62 are allocated to each of the circuit areas 72. In this way, the numbers of the via conductors 61 and 62 respectively allocated to associated ones of the circuit areas 71 and 72 may be two or more.

Figure 12:
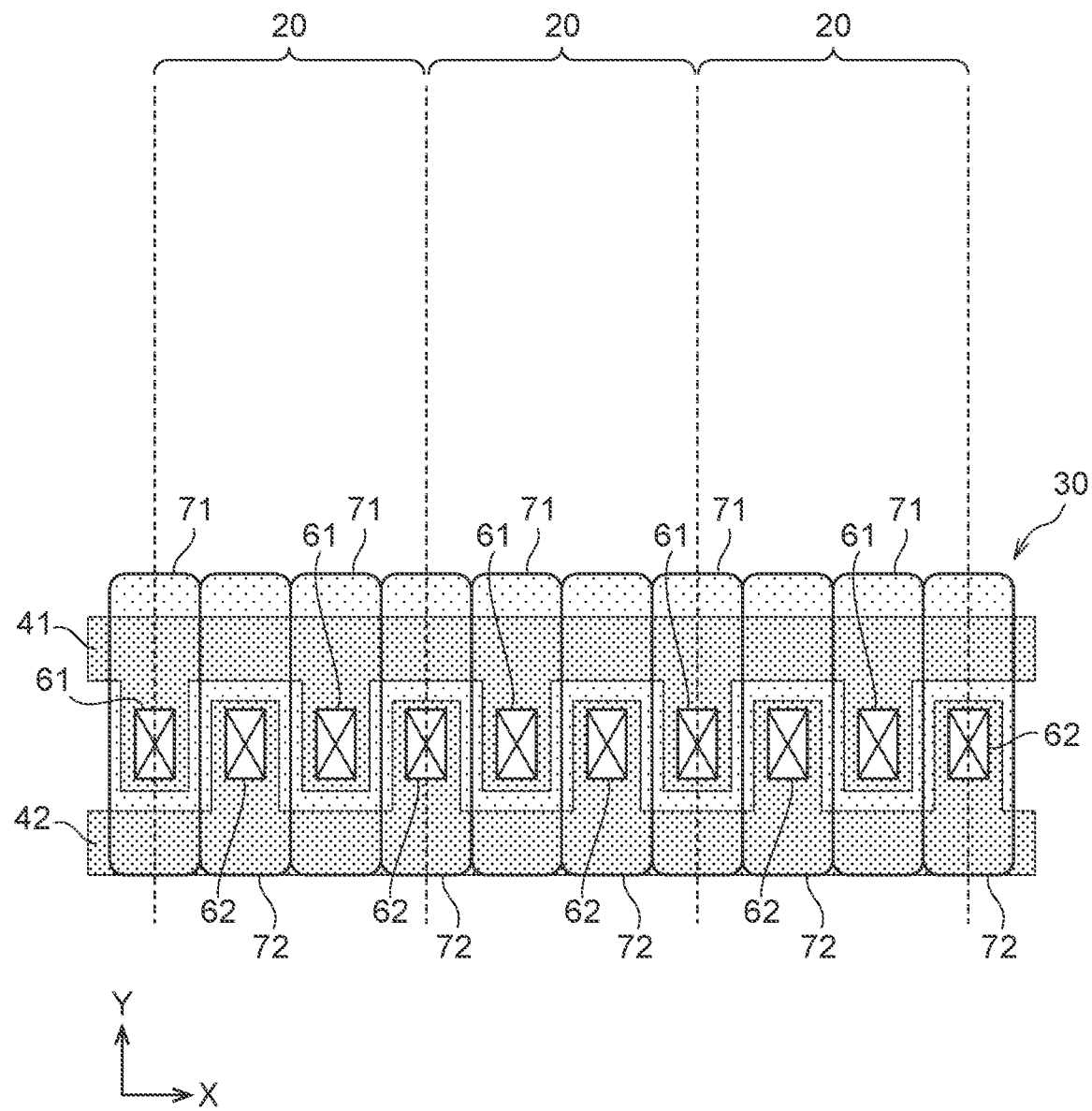
FIG. 12 is a schematic plan view for explaining a layout of via conductors according to a third embodiment of the present disclosure.

FIG. 12 is a schematic plan view for explaining a layout of the via conductors 61 and 62 according to a third embodiment of the present disclosure. In the example shown in FIG. 12, the array pitch in the X direction of the unit circuits 20 is three times as large as the array pitch in the X direction of the circuit areas 71 and 72. Boundary locations of the unit circuits 20 adjacent in the X direction are alternately positioned on the circuit areas 71 and 72. In this way, the array pitch in the X direction of the unit circuits 20 and the array pitch in the X direction of the circuit areas 71 and 72 may have any relation.

Figure 13:
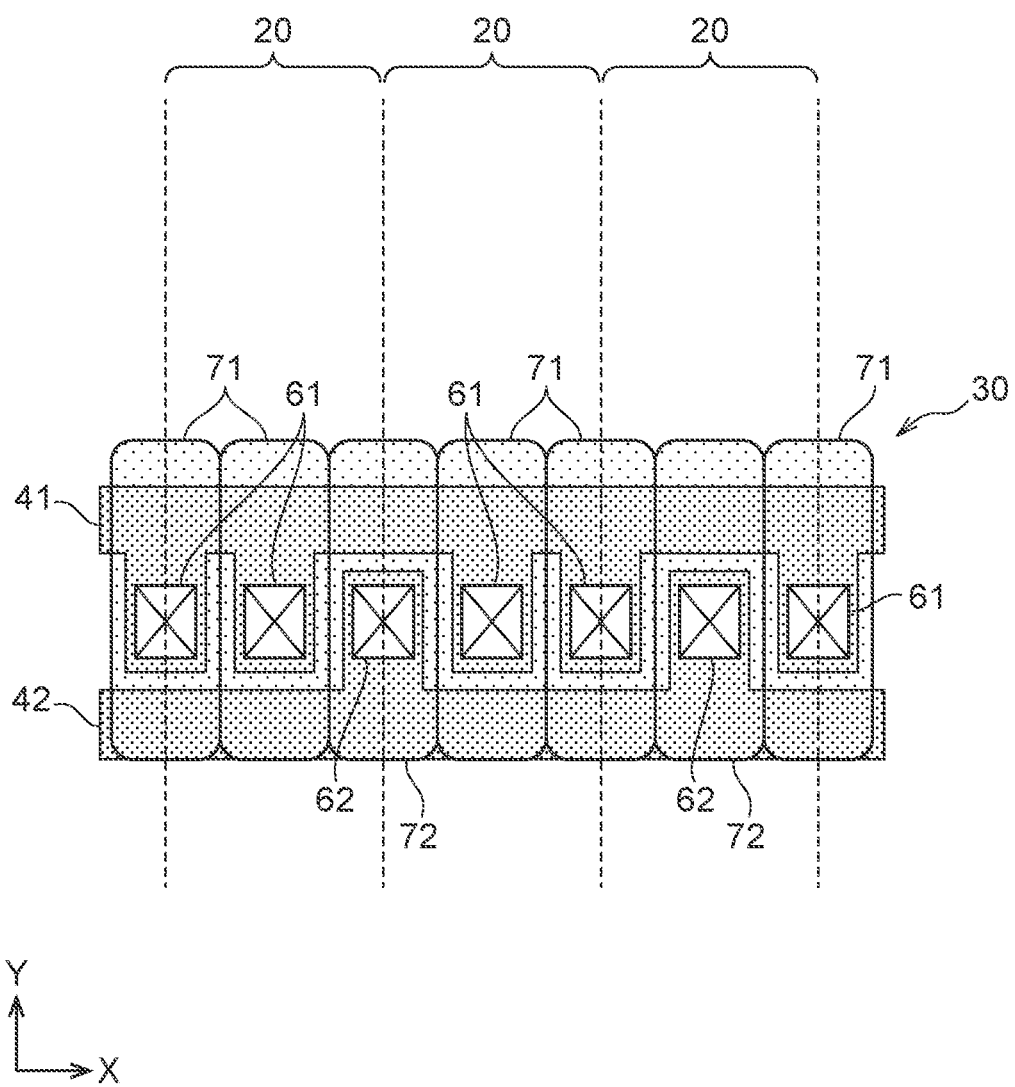
FIG. 13 is a schematic plan view for explaining a layout of via conductors according to a fourth embodiment of the present disclosure.

FIG. 13 is a schematic plan view for explaining a layout of the via conductors 61 and 62 according to a fourth embodiment of the present disclosure. In the example shown in FIG. 13, the number of the circuit areas 71 is greater than that of the circuit areas 72. Specifically, the number of the circuit areas 71 is twice as great as the number of the circuit areas 72. Therefore, the number of the via conductors 61 is also twice as great as the number of the via conductors 62. In this way, the number of the circuit areas 71 and the number of the circuit areas 72 are not necessarily equal. Due to the increase in the number of the circuit areas 71 that receive the power voltage VDD2H, the wiring resistance between the power supply line L1 and the power supply line L4 is more reduced when the power voltage VDD2H is selected by the switch circuit 31, and therefore a higher operation can be performed.

Figure 14A:
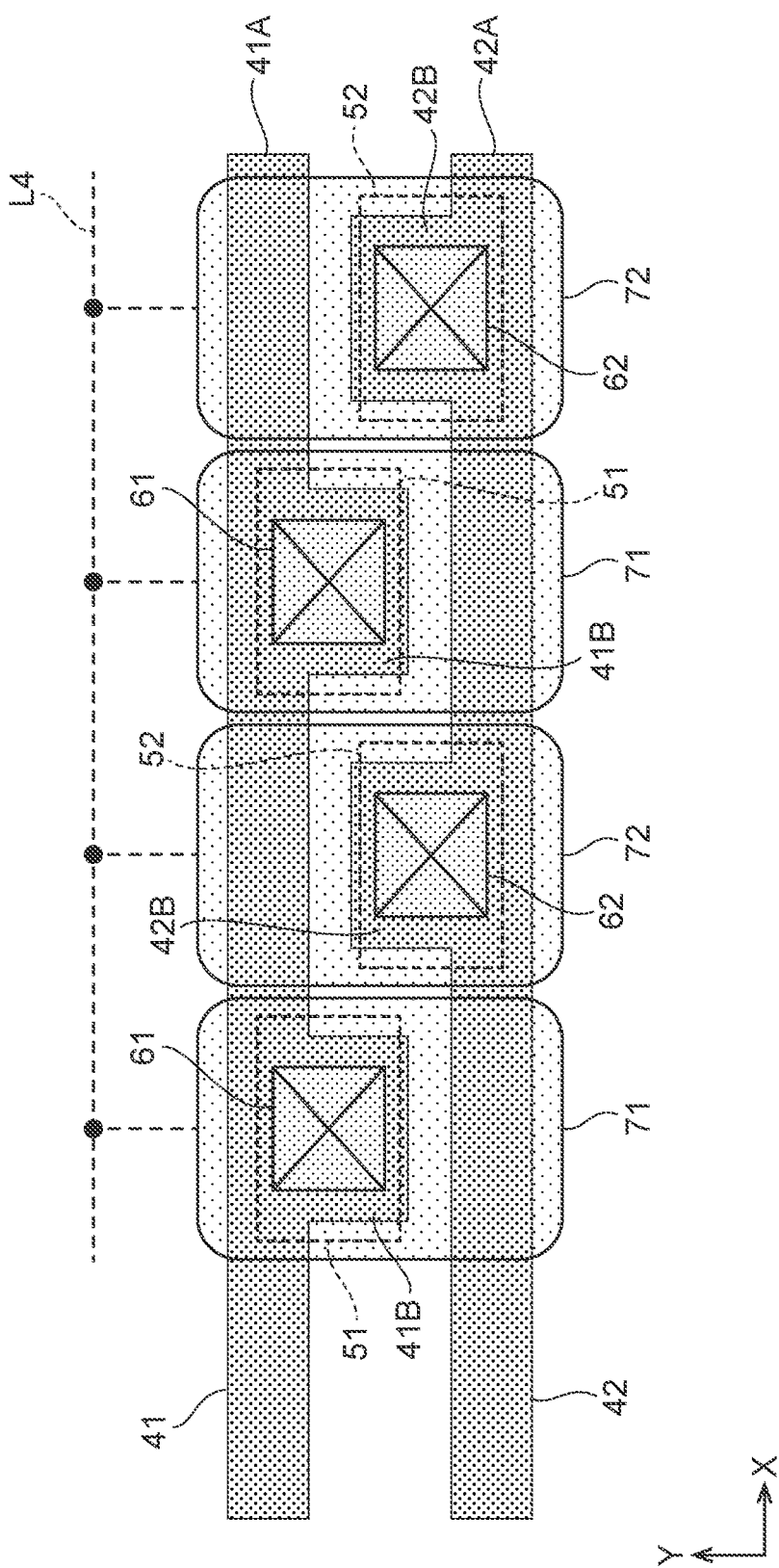
FIGS. 14A to 14C are schematic plan views for explaining a layout of via conductors according to a fifth embodiment of the present disclosure.
Figure 14B:
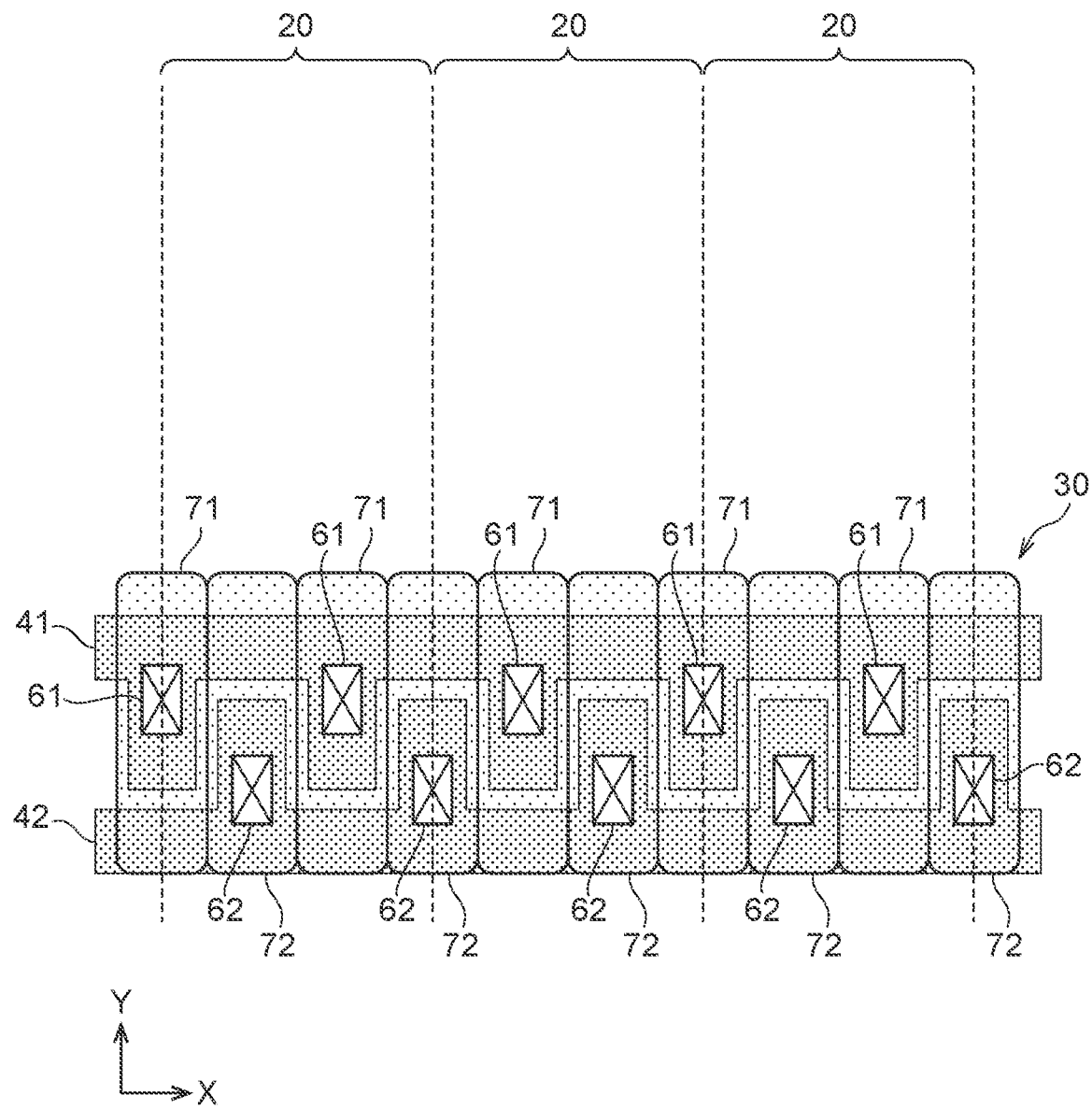
Figure 14C:
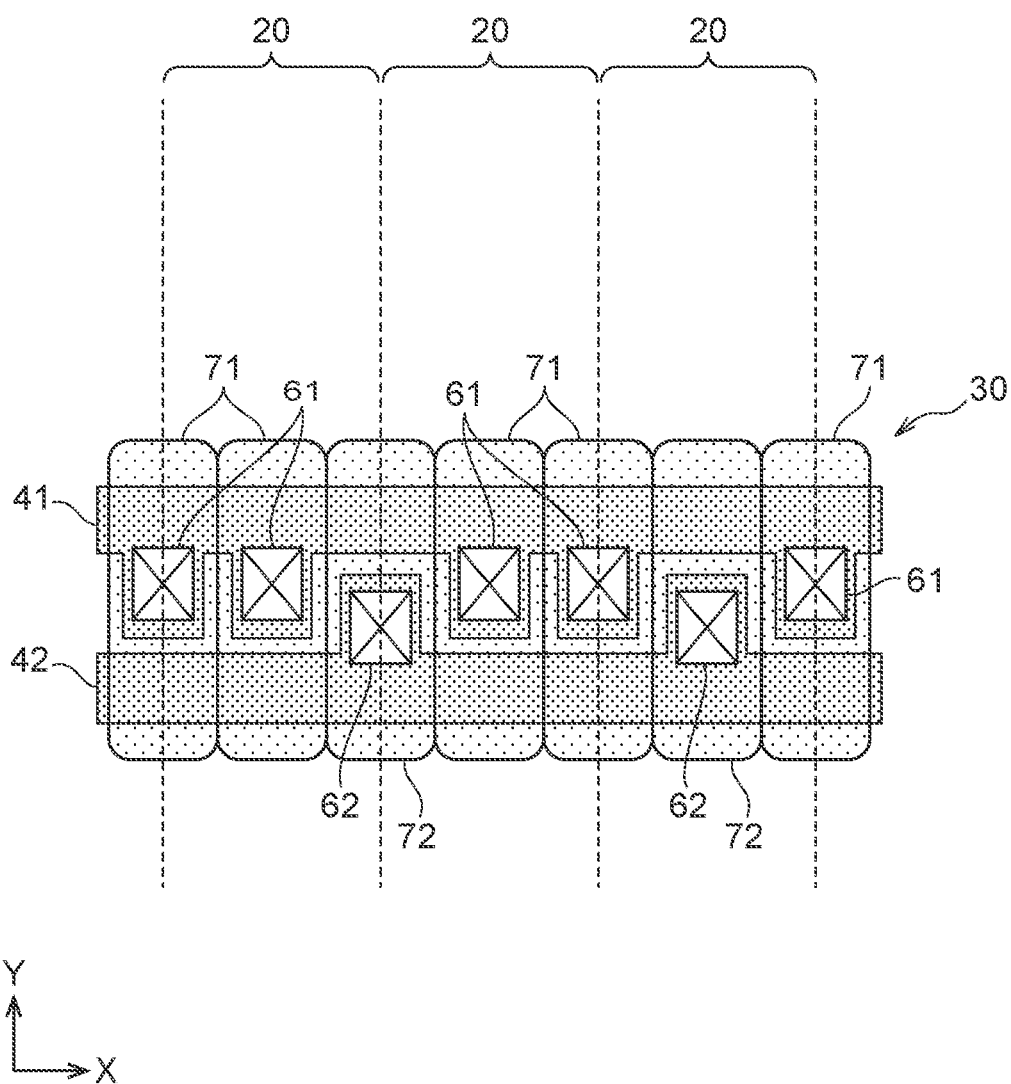

FIG. 14A is a schematic plan view for explaining a layout of the via conductors 61 and 62 according to a fifth embodiment of the present disclosure. In the example shown in FIG. 14A, the locations in the Y direction of the via conductors 61 are different from the locations in the Y direction of the via conductors 62. This layout is suitable for a case in which the distance in the Y direction between the line section 41A of the iRDL 41 and the line section 42A of the iRDL 42 is short. In this way, alignment of the via conductors 61 and 62 in the X direction is not essential. Also in the present embodiment, the array pitch in the X direction of the unit circuits 20 may be three times as large as the array pitch in the X direction of the circuit areas 71 and 72 as shown in FIG. 14B, or the number of the circuit areas 71 may be greater than that of the circuit areas 72 as shown in FIG. 14C.

Figure 15:
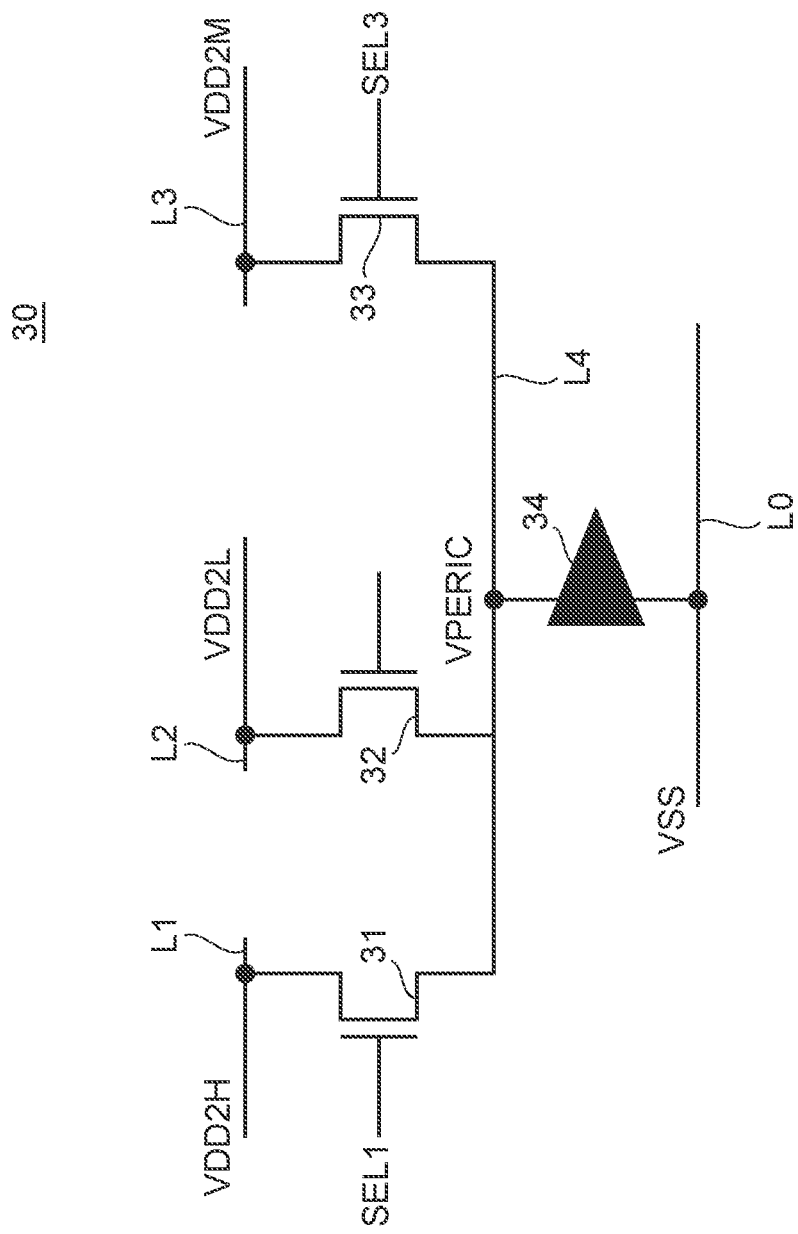
FIG. 15 is a circuit diagram of a power selector circuit according to a sixth embodiment of the present disclosure.

FIG. 15 is a circuit diagram of the power selector circuit 30 according to a sixth embodiment of the present disclosure. The power selector circuit 30 shown in FIG. 15 has a configuration in which a switch circuit 33 coupled between a power supply line L3 and the power supply line L4 is added. The switch circuit 33 is constituted of an N-channel MOS transistor. While being represented by one transistor in FIG. 15, each of the switch circuits 31 to 33 may have a configuration in which a plurality of transistors are coupled in parallel. A selection signal SEL3 is supplied to a gate electrode of the transistor constituting the switch circuit 33. The selection signals SEL1 to SEL3 are activated mutually exclusively. A power voltage VDD2M is supplied from outside to the power supply line L3. The power voltages VDD2H, VDD2L, and VDD2M have different levels. As an example, VDD2H>VDD2M>VDD2L. In this case, with activation of the selection signal SEL3, the current consumption can be reduced more than in a case where the selection signal SEL1 is activated, and the driver circuit 34 can be operated at a higher speed than in a case where the selection signal SEL2 is activated.

Figure 16:
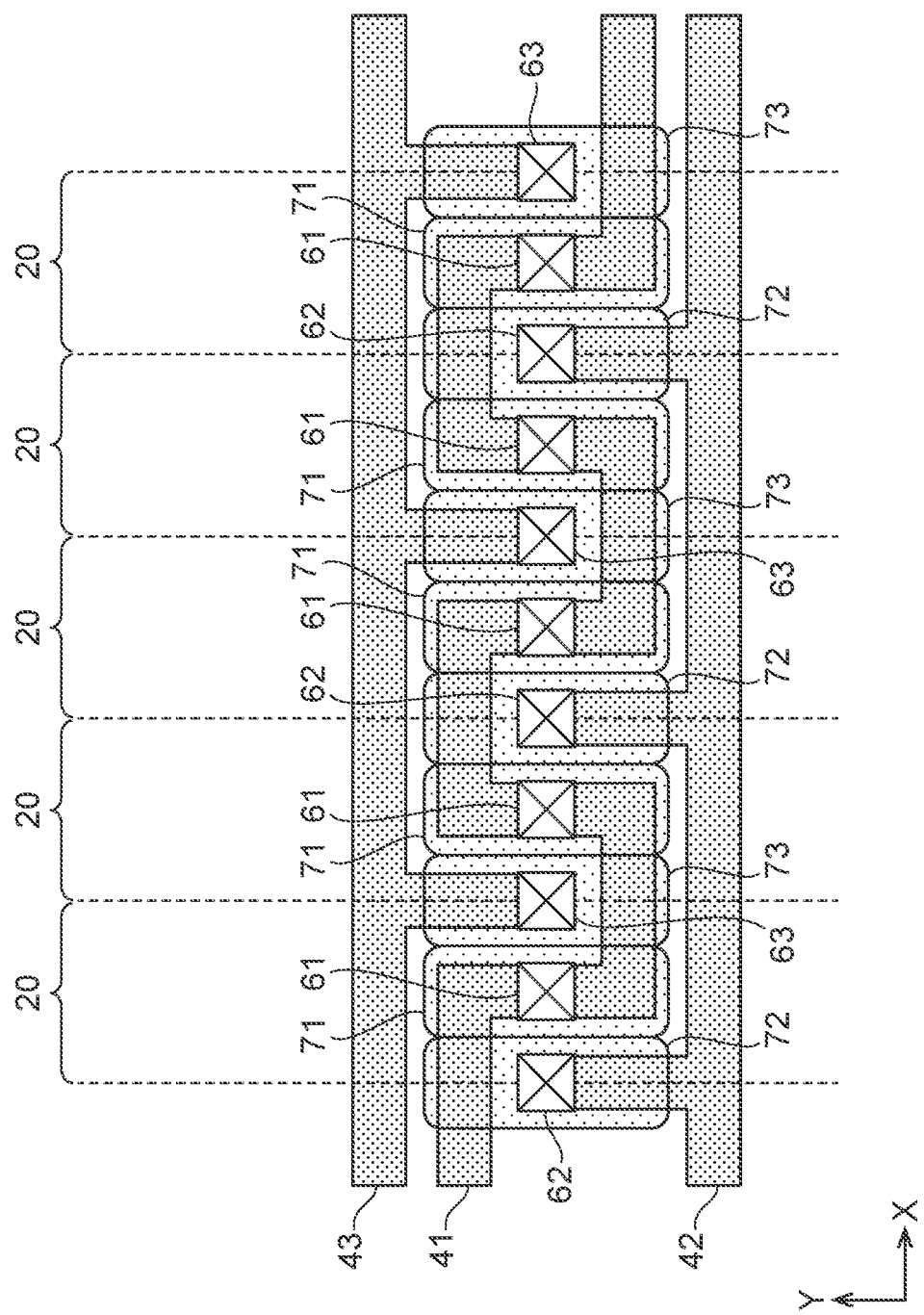
FIG. 16 is a schematic plan view for explaining a layout of the via conductors according to the sixth embodiment.

FIG. 16 is a schematic plan view for explaining a layout of the via conductors 61 and 62 and via conductors 63 according to the sixth embodiment of the present disclosure. An iRDL 43 corresponds to the power supply line L3 and is coupled to an external power terminal supplied with the power voltage VDD2M. Circuit areas 73 are areas where the switch circuit 33 is placed. The iRDL 43 is coupled to the circuit areas 73 through via conductors 63, respectively. In the example shown in FIG. 16, the circuit areas 71 to 73 are arrayed in the X direction in such a manner that the circuit areas 72 and the circuit areas 73 are alternately interposed between two of the circuit areas 71. Accordingly, the number of the circuit areas 71 is equal to the total number of the circuit areas 72 and 73. As described above, the power selector circuit 30 may select one power voltage from three or more power voltages.

Although this disclosure has been disclosed in the context of certain preferred embodiments and examples, it will be understood by those skilled in the art that the disclosures extend beyond the specifically disclosed embodiments to other alternative embodiments and/or uses of the disclosures and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosures. It should be understood that various features and aspects of the disclosed embodiments can be combined with or substituted for one another in order to form varying mode of the disclosure. Thus, it is intended that the scope of at least some of the present disclosure herein disclosed should not be limited by the particular disclosed embodiments described above.

The invention claimed is:

1. An apparatus comprising:
a driver circuit configured to operate on a power voltage supplied from an internal power supply line;
a first external power supply line supplied with a first external power voltage;
a second external power supply line supplied with a second external power voltage different from the first external power voltage;
a plurality of first switch circuits coupled between the first external power supply line and the internal power supply line, the plurality of first switch circuits being arranged on a plurality of first circuit areas; and
a plurality of second switch circuits coupled between the second external power supply line and the internal power supply line, the plurality of second switch circuits being arranged on a plurality of second circuit areas, wherein
the plurality of first circuit areas and the plurality of second circuit areas are arranged in a first direction in a predetermined order, and
the first and second external power supply lines are inline redistribution layer (iRDL) lines in an uppermost wiring layer.

2. The apparatus of claim 1, wherein the first and second external power supply lines extend in the first direction in parallel.

3. The apparatus of claim 2, further comprising:
a plurality of first conductive patterns arranged on an associated one of the plurality of first circuit areas;
a plurality of second conductive patterns arranged on an associated one of the plurality of second circuit areas;
a plurality of first via conductors each coupling the first external power supply line to an associated one of the plurality of first conductive patterns; and
a plurality of second via conductors each coupling the second external power supply line to an associated one of the plurality of second conductive patterns.

4. The apparatus of claim 3,
wherein the first and second conductive patterns are arranged on a first wiring layer positioned below the iRDL, and
wherein each of the first and second conductive patterns extends in the first direction.

5. The apparatus of claim 4,
wherein at least a part of the internal power supply line are arranged on a second wiring layer positioned below the first wiring layer, and
wherein the part of the internal power supply line arranged on the second wiring layer extends in a second direction crossing the first direction.

6. The apparatus of claim 3, wherein the first and second via conductors are arranged in the first direction.

7. The apparatus of claim 3,
wherein the plurality of first via conductors are arranged in the first direction, and
wherein the plurality of second via conductors are arranged in the first direction.

8. The apparatus of claim 1, the first and second circuit areas are alternately arranged in the first direction.

9. The apparatus of claim 1, further comprising:
a data I/O terminal;
an output buffer circuit configured to output read data to the data I/O terminal; and
a pre-buffer circuit configured to drive the output buffer circuit,
wherein the pre-buffer circuit includes the driver circuit.

10. The apparatus of claim 1, further comprising:
a data I/O terminal; and
an input receiver circuit configured to receive a write data supplied from the data I/O terminal,
wherein the input receiver circuit includes the driver circuit.

11. An apparatus, comprising:
a driver circuit configured to operate on a power voltage supplied from an internal power supply line;
a first external power supply line supplied with a first external power voltage;
a second external power supply line supplied with a second external power voltage different from the first external power voltage;
a plurality of first switch circuits coupled between the first external power supply line and the internal power supply line, the plurality of first switch circuits being arranged on a plurality of first circuit areas; and
a plurality of second switch circuits coupled between the second external power supply line and the internal power supply line, the plurality of second switch circuits being arranged on a plurality of second circuit areas, wherein
the plurality of first circuit areas and the plurality of second circuit areas are arranged in a first direction in a predetermined order,
the first circuit areas are greater in number than the second circuit areas, and
the first external power voltage is higher than the second external power voltage.

12. An apparatus, comprising:
a driver circuit configured to operate on a power voltage supplied from an internal power supply line;
a first external power supply line supplied with a first external power voltage;
a second external power supply line supplied with a second external power voltage different from the first external power voltage;
a plurality of first switch circuits coupled between the first external power supply line and the internal power supply line, the plurality of first switch circuits being arranged on a plurality of first circuit areas; and
a plurality of second switch circuits coupled between the second external power supply line and the internal power supply line, the plurality of second switch circuits being arranged on a plurality of second circuit areas, wherein
the plurality of first circuit areas and the plurality of second circuit areas are arranged in a first direction in a predetermined order,
the apparatus further comprises:
   a third external power supply line supplied with a third external power voltage different from the first and second external power voltages; and
   a plurality of third switch circuits coupled between the third external power supply line and the internal power supply line, the plurality of third switch circuits being arranged on a plurality of third circuit areas, and
the first, second, and third circuit areas are arranged in the first direction.

13. An apparatus, comprising:
a driver circuit configured to operate on a power voltage supplied from an internal power supply line;
a first external power supply line supplied with a first external power voltage;
a second external power supply line supplied with a second external power voltage different from the first external power voltage;
a plurality of first switch circuits coupled between the first external power supply line and the internal power supply line, the plurality of first switch circuits being arranged on a plurality of first circuit areas; and
a plurality of second switch circuits coupled between the second external power supply line and the internal power supply line, the plurality of second switch circuits being arranged on a plurality of second circuit areas, wherein
the plurality of first circuit areas and the plurality of second circuit areas are arranged in a first direction in a predetermined order,
the apparatus further comprises a serializer configured to convert the read data from parallel into serial and supply the read data in serial to the pre-buffer circuit, and
the serializer includes the driver circuit.

14. An apparatus, comprising:
a driver circuit configured to operate on a power voltage supplied from an internal power supply line;
a first external power supply line supplied with a first external power voltage;
a second external power supply line supplied with a second external power voltage different from the first external power voltage;
a plurality of first switch circuits coupled between the first external power supply line and the internal power supply line, the plurality of first switch circuits being arranged on a plurality of first circuit areas; and
a plurality of second switch circuits coupled between the second external power supply line and the internal power supply line, the plurality of second switch circuits being arranged on a plurality of second circuit areas, wherein
the plurality of first circuit areas and the plurality of second circuit areas are arranged in a first direction in a predetermined order,
the apparatus further comprises:
   a data bus; and
   a data bus buffer circuit configured to output the write data to the data bus, and
the data bus buffer circuit includes the driver circuit.

* * * * *